(12) United States Patent
Zhou et al.

(10) Patent No.: US 10,304,866 B1
(45) Date of Patent: May 28, 2019

(54) FFS TYPE TFT ARRAY SUBSTRATE AND THE MANUFACTURING METHOD THEREOF

(71) Applicant: Shenzhen China Star Optoelectronics Semiconductor Display Technology Co., Ltd., Shenzhen (CN)

(72) Inventors: Zhichao Zhou, Shenzhen (CN); Hui Xia, Shenzhen (CN); Meng Chen, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/749,107

(22) PCT Filed: Dec. 20, 2017

(86) PCT No.: PCT/CN2017/117346
§ 371 (c)(1),
(2) Date: Jan. 30, 2018

(30) Foreign Application Priority Data

Nov. 22, 2017 (CN) .......................... 2017 1 1177283

(51) Int. Cl.
*H01L 27/12* (2006.01)
*G02F 1/1343* (2006.01)

(52) U.S. Cl.
CPC ...... *H01L 27/124* (2013.01); *G02F 1/134309* (2013.01); *H01L 27/127* (2013.01); *H01L 27/1237* (2013.01); *H01L 27/1288* (2013.01); *G02F 2001/134372* (2013.01); *G02F 2201/121* (2013.01); *G02F 2201/123* (2013.01)

(58) Field of Classification Search
CPC ................... G02F 2001/13629; H01L 27/1288
See application file for complete search history.

(56) References Cited

U.S. PATENT DOCUMENTS

2006/0290867 A1* 12/2006 Ahn ................. G02F 1/134363
349/141
2011/0062436 A1* 3/2011 Yamazaki ........... H01L 27/1225
257/43

FOREIGN PATENT DOCUMENTS

| CN | 101847641 A | 9/2010 |
|----|-------------|--------|
| CN | 102769040 A | 11/2012 |
| CN | 104681565 A | 6/2015 |
| CN | 105870136 A | 8/2016 |
| CN | 106711159 A | 5/2017 |
| CN | 107316875 A | 11/2017 |

* cited by examiner

*Primary Examiner* — Thomas L Dickey
(74) *Attorney, Agent, or Firm* — Leong C. Lei

(57) ABSTRACT

The present invention provides an FFS type TFT array substrate and a manufacturing method thereof. The manufacturing method for an FFS type TFT array substrate of the present invention comprises that a gate electrode, a scanning line, a common electrode, and a common electrode line are formed in one photomask process. Comparing with the conventional art, the present invention simplifies the manufacturing process, with fewer photomasks, and a shorter processing time, therefore, the production cost is low. The fabrication process of the FFS type TFT array substrate of the present invention is simple, has low production cost and excellent electrical performance.

12 Claims, 15 Drawing Sheets

```
┌─────────────────────────────────────────────────────┐
│  A gate electrode, a scanning line, a common        │
│  electrode and a common electrode line are formed   │──── S1
│  on the base substrate by using a first photomask   │
│  process.                                           │
└─────────────────────────────────────────────────────┘
                          │
                          ▼
┌─────────────────────────────────────────────────────┐
│  A gate insulating layer and a semiconductor layer  │
│  are deposited. An active layer is formed by        │──── S2
│  patterning the semiconductor layer with a second   │
│  photomask process.                                 │
└─────────────────────────────────────────────────────┘
                          │
                          ▼
┌─────────────────────────────────────────────────────┐
│  A source electrode, a drain electrode, and a data  │──── S3
│  line are formed by using a third photomask process.│
└─────────────────────────────────────────────────────┘
                          │
                          ▼
┌─────────────────────────────────────────────────────┐
│  A passivation layer is formed, a first through     │
│  hole is formed on the passivation layer by using   │
│  a fourth photomask process; or, a passivation      │
│  layer is formed and a planer layer on the          │──── S4
│  passivation layer is formed, a second through      │
│  hole is formed on the passivation layer and the    │
│  planer layer by using a fourth photomask process.  │
└─────────────────────────────────────────────────────┘
                          │
                          ▼
┌─────────────────────────────────────────────────────┐
│  A pixel electrode is formed by using a fifth       │
│  photomask process, the pixel electrode is          │
│  connected with the drain electrode via the first   │
│  through hole located on the passivation layer, or, │──── S5
│  the pixel electrode is connected with the drain    │
│  electrode via the second through hole located on   │
│  the passivation layer and the planer layer         │
└─────────────────────────────────────────────────────┘
```

FIG. 1

FFS TYPE TFT ARRAY SUBSTRATE AND THE MANUFACTURING METHOD THEREOF

BACKGROUND OF THE INVENTION

Field of Invention

The present invention relates to the field of display technology, and more particularly to a fringe field switching (FFS) thin film transistor (TFT) array substrate and a manufacturing thereof.

Description of Prior Art

Liquid crystal displays (LCDs) such as flat panel display devices are widely used in mobile phones, televisions, personal digital assistants, digital cameras, notebooks, desktop, other consumer electronics products and etc. for high quality, power saving, thin body and wide application range. The LCDs has become the mainstream in display device.

Most of the liquid crystal display (LCD) devices on the market are backlight type LCDs, which comprise a LCD panel and a backlight module. In general, the LCD panel is composed of a color filter (CF) substrate, a thin film transistor (TFT) substrate, a liquid crystal (LC) sandwiched between the CF substrate and the TFT substrate, and a sealant frame sealant.

TFT-LCDs can be classified into a vertical electric field type and a horizontal electric field type, according to the direction of the electric field driving the LC. A vertical electric field TFT-LCD needs to form pixel electrodes on the TFT array substrate and form common electrodes on the CF substrate; and a horizontal electric field TFT-LCD needs to form pixel electrodes and common electrodes on the TFT array substrate at the same time. The vertical electric field type TFT-LCDs comprise a twist nematic (TN) TFT-LCD; the horizontal electric field TFT-LCDs comprise a Fringe Field Switching (FFS) type TFT-LCD and an in-plane switching (IPS) type TFT-LCD. The horizontal electric field TFT-LCDs, especially, the FFS TFT-LCDs are widely used in the field of LCDs, for its high transmittance, wide viewing angle, fast response and low power consumption, and etc. However, presently, the manufacturing method for the FFS type TFT array substrate usually uses 6 photomask processes. Due to the high fabrication cost of the photomask and the long process time of the 6 photomask processes, the current fabrication cost of the FFS type TFT array substrate is relatively high.

SUMMARY OF THE INVENTION

An object of the present invention is to provide a method for fabricating an FFS type TFT array substrate, which uses less photomask processes and low production cost.

An object of the present invention is to further provide an FFS type TFT array substrate with a simple fabrication process, low production cost and excellent electrical performance.

In order to achieve the object, the present invention provides a manufacturing method for an FFS type TFT array substrate, which comprises:

A base substrate is provided. A gate electrode, a scanning line, a common electrode and a common electrode line are formed on the base substrate by using a first photomask process. The gate electrode is connected with the scanning line. The common electrode is connected with the common electrode line.

A gate insulating layer is deposited on the gate electrode, the scanning line, the common electrode, the common electrode line and the base substrate. A semiconductor layer is deposited on the gate insulating layer. The semiconductor layer is patterned by using a second photomask process, so as to obtain an active layer corresponding onto the gate electrode.

A source/drain metal layer is deposited on the active layer and the gate insulating layer. The source/drain metal layer is patterned by using a third photomask process, so as to obtain a source electrode, a drain electrode, and a data line. The source electrode and the drain electrode are respectively in contact with the active layer. The data line is connected with the source electrode.

A passivation layer is formed on the source electrode, the drain electrode, the data line, the active layer, and the gate insulating layer. The passivation layer is patterned by using a fourth photomask process, so as to obtain a first through hole located on the passivation layer. The first through hole is disposed corresponding onto the drain electrode. A second transparent conductive layer is deposited on the passivation layer, and the second transparent conductive layer is patterned by using a fifth photomask process, so as to obtain a pixel electrode on the passivation layer. The pixel electrode is connected with the drain electrode via the first through hole located on the passivation layer.

Or, a passivation layer is formed on the source electrode, the drain electrode, the data line, the active layer, and the gate insulating layer. A planer layer is formed on the passivation layer. The passivation layer and the planer layer are patterned by using a fourth photomask process, so as to obtain a second through hole located on the passivation layer and the planer layer. The second through hole is disposed corresponding onto the drain electrode. A second transparent conductive layer is deposited on the planer layer. The second transparent conductive layer is patterned by using a fifth photomask process, so as to obtain a pixel electrode on the planer layer. The pixel electrode is connected with the drain electrode via the second through hole located on the passivation layer and the planer layer.

In the step of forming a gate electrode, a scanning line, a common electrode and a common electrode line on the base substrate by using a first photomask process further comprises:

A first transparent conductive layer is deposited on the base substrate. The first transparent conductive layer is patterned by using the first photomask process, so as to obtain a predetermined pattern of the gate electrode and a predetermined pattern of the scanning line, the common electrode, and the common electrode line.

A first metal layer is plated on the predetermined pattern of the gate electrode and the predetermined pattern of the scanning line, so as to obtain the gate electrode and the scanning line. A conductivity of the first metal layer is greater than a conductivity of the first transparent conductive layer.

The first transparent conductive layer is selected from the group consisting of transparent conductive metal oxide. The first metal layer is selected from the group consisting of copper.

A process of plating a first metal layer on the predetermined pattern of the gate electrode and the predetermined pattern of the scanning line is an electroplating process.

The passivation layer is selected from the group consisting of silicon oxide and silicon nitride. The planer layer is selected from the group consisting of an organic photoresist material.

After the passivation layer is formed on the source electrode, the drain electrode, the data line, the active layer, and the gate insulating layer, the fourth photomask process comprises processes of coating photoresist, exposure, development, dry etching and photoresist stripping.

After the passivation layer is formed on the source electrode, the drain electrode, the data line, the active layer, and the gate insulating layer, and the planer layer is formed on the passivation layer, the fourth photomask process comprises processes of exposure, development, and dry etching.

The present invention further provides an FFS TFT array substrate, which comprises:

A base substrate.

A gate electrode, a scanning line, a common electrode, and a common electrode line are disposed on the base substrate. The gate electrode is connected with the scanning line. The common electrode is connected with the common electrode line.

A gate insulating layer is disposed on the gate electrode, the scanning line, the common electrode, the common electrode line and the base substrate.

An active layer is disposed on the gate insulating layer and corresponding onto the gate electrode.

A source electrode and a drain electrode are disposed on the active layer and the gate insulating layer. A data line is disposed on the gate insulating layer. The source electrode and the drain electrode are respectively in contact with the active layer. The data line is connected with the source electrode.

A passivation layer is disposed on the source electrode, the drain electrode, the data line, the active layer, and the gate insulating layer. A first through hole is disposed on the passivation layer and corresponding onto the drain electrode. A pixel electrode is disposed on the passivation layer. The pixel electrode is connected with the drain electrode via the first through hole located on the passivation layer.

Or, a passivation layer is disposed on the source electrode, the drain electrode, the data line, the active layer, and the gate insulating layer. A planer layer is disposed on the passivation layer. A second through hole is disposed on the passivation layer and the planer layer and corresponding disposed onto the drain electrode. A pixel electrode is disposed on the planer layer. The pixel electrode is connected with the drain electrode via the second through hole located on the passivation layer and the planer layer.

The common electrode and the common electrode line comprise a first transparent conductive layer disposed on the base substrate. The gate electrode and the scanning line comprise the first transparent conductive layer and a first metal layer disposed on the first transparent conductive layer. A conductivity of the first metal layer is greater than a conductivity of the first transparent conductive layer.

The first transparent conductive layer is selected from the group consisting of transparent conductive metal oxide. The first metal layer is selected from the group consisting of copper.

The passivation layer is selected from the group consisting of silicon oxide and silicon nitride. The planer layer is selected from the group consisting of an organic photoresist material.

The present invention further provides another manufacturing method for an FFS type TFT array substrate, which comprises:

A base substrate is provided. A gate electrode, a scanning line, a common electrode and a common electrode line are formed on the base substrate by using a first photomask process. The gate is connected with the scanning line. The common electrode is connected with the common electrode line.

A gate insulating layer is deposited on the gate, the scanning line, the common electrode, the common electrode line and the base substrate. A semiconductor layer is deposited on the gate insulating layer. The semiconductor layer is patterned by using a second photomask process, so as to obtain an active layer corresponding onto the gate electrode.

A source/drain metal layer is deposited on the active layer and the gate insulating layer. The source/drain metal layer is patterned by using a third photomask process, so as to obtain a source electrode, a drain electrode, and a data line. The source electrode and the drain electrode are respectively in contact with the active layer. The data line is connected with the source electrode.

A passivation layer is formed on the source electrode, the drain electrode, the data line, the active layer, and the gate insulating layer. The passivation layer is patterned by using a fourth photomask process, so as to obtain a first through hole located on the passivation layer. The first through hole is disposed corresponding onto the drain electrode. A second transparent conductive layer is deposited on the passivation layer, and the second transparent conductive layer is patterned by using a fifth photomask process, so as to obtain a pixel electrode on the passivation layer. The pixel electrode is connected with the drain electrode via the first through hole located on the passivation layer.

Or, a passivation layer is formed on the source electrode, the drain electrode, the data line, the active layer, and the gate insulating layer. A planer layer is formed on the passivation layer. The passivation layer and the planer layer are patterned by using a fourth photomask process, so as to obtain a second through hole located on the passivation layer and the planer layer. The second through hole is disposed corresponding onto the drain electrode. A second transparent conductive layer is deposited on the planer layer. The second transparent conductive layer is patterned by using a fifth photomask process, so as to obtain a pixel electrode on the planer layer. The pixel electrode is connected with the drain electrode via the second through hole located on the passivation layer and the planer layer.

Wherein in the step of forming a gate electrode, a scanning line, a common electrode and a common electrode line on the base substrate by using a first photomask process further comprises:

A first transparent conductive layer is deposited on the base substrate. The first transparent conductive layer is patterned by using the first photomask process, so as to obtain a predetermined pattern of the gate electrode and a predetermined pattern of the scanning line, the common electrode, and the common electrode line.

A first metal layer is plated on the predetermined pattern of the gate electrode and the predetermined pattern of the scanning line, so as to obtain the gate electrode and the scanning line. A conductivity of the first metal layer is greater than a conductivity of the first transparent conductive layer.

Wherein the first transparent conductive layer is selected from the group consisting of transparent conductive metal oxide. The first metal layer is selected from the group consisting of copper.

Wherein a process of plating a first metal layer on the predetermined pattern of the gate electrode and the predetermined pattern of the scanning line is an electroplating process.

The passivation layer is selected from the group consisting of silicon oxide and silicon nitride. The planer layer is selected from the group consisting of an organic photoresist material.

The beneficial effects of the present invention are: The manufacturing method for an FFS type TFT array substrate of the present invention comprises that a gate electrode, a scanning line, a common electrode, and a common electrode line are formed in one photomask process. Comparing with the conventional art, the present invention simplifies the manufacturing process, with fewer photomasks, and a shorter processing time, therefore, the production cost is low. The fabrication process of the FFS type TFT array substrate of the invention is simple, has low production cost and excellent electrical performance.

For further understanding of the features and technical contents of the present invention, reference should be made to the following detailed description and accompanying drawings of the present invention. However, the drawings are for reference only and are not intended to limit the present invention.

BRIEF DESCRIPTION OF THE DRAWINGS

The technical solutions of the present invention and other beneficial effects will be apparent from the following detailed description of specific embodiments of the present invention with reference to the accompanying drawings.

In drawings:

FIG. 1 is a flowchart of a manufacturing method for an FFS type TFT array substrate according to the present invention.

DETAILED DESCRIPTION OF THE PREFERRED EMBODIMENTS

To further illustrate the technical solutions adopted by the present invention and the effects thereof, the following describes the preferred embodiments of the present invention and the accompanying drawings in detail.

Please refer to FIG. 1, the present invention provides a manufacturing method for an FFS type TFT array substrate, which comprises below steps:

S1, as shown in FIGS. 2-5. A base substrate 10 is provided. A gate electrode 21, a scanning line 22, a common electrode 23 and a common electrode line 24 are formed on the base substrate 10 by using a first photomask process. The gate electrode 21 is connected with the scanning line 22. The common electrode 23 is connected with the common electrode line 24.

Figure 2:
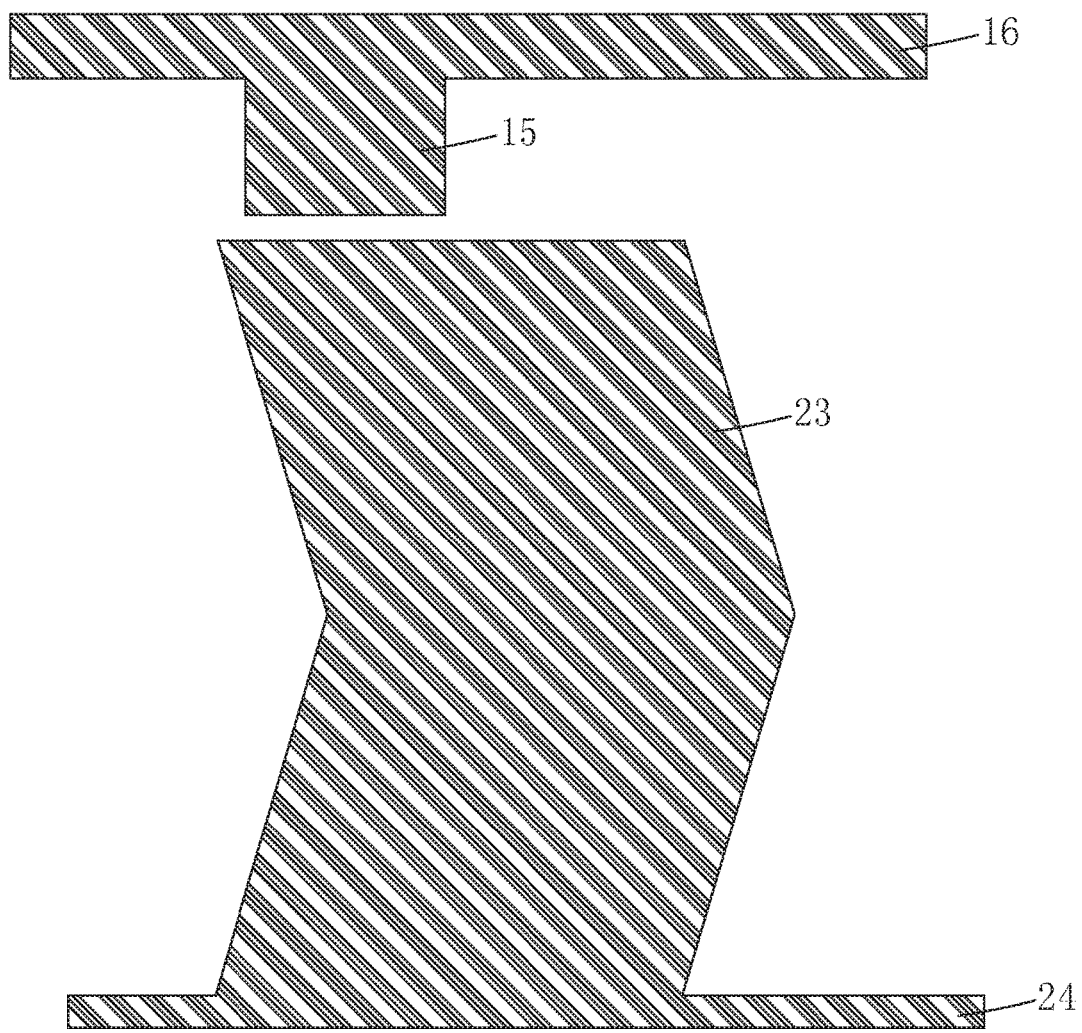
FIG. 2 is a schematic top view of a step S11 of the manufacturing method for an FFS type TFT array substrate according to the present invention.
Figure 3:
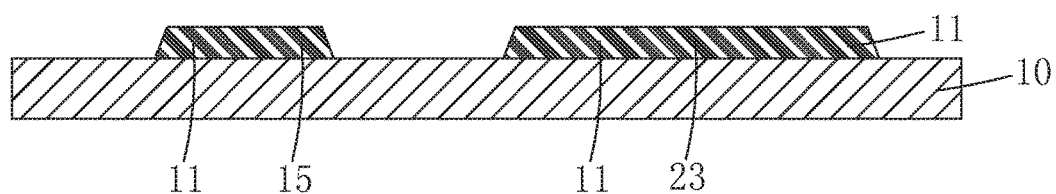
FIG. 3 is a schematic cross-sectional view of FIG. 2.

Specifically, the step of forming a gate electrode 21, a scanning line 22, a common electrode 23 and a common electrode line 24 on the base substrate 10 by using a first photomask process further comprises:

S11, as shown in FIGS. 2-3. A first transparent conductive layer 11 is deposited on the base substrate 10. The first transparent conductive layer 11 is patterned by using the first photomask process, so as to obtain a predetermined pattern of the gate electrode 15 and a predetermined pattern of the scanning line 16, the common electrode 23, and the common electrode line 24.

Figure 4:
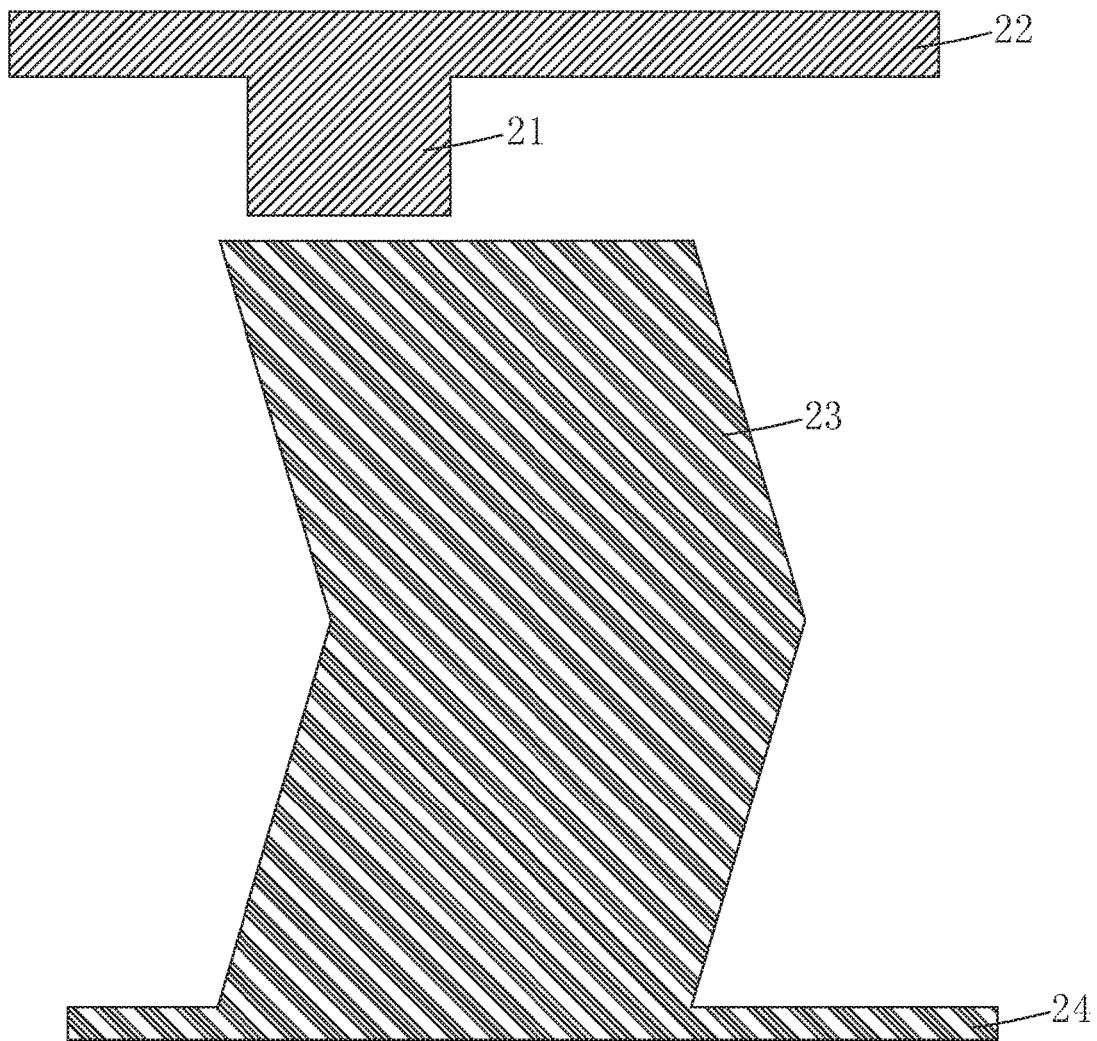
FIG. 4 is a schematic top view of a step S12 of the manufacturing method for an FFS type TFT array substrate according to the present invention.
Figure 5:
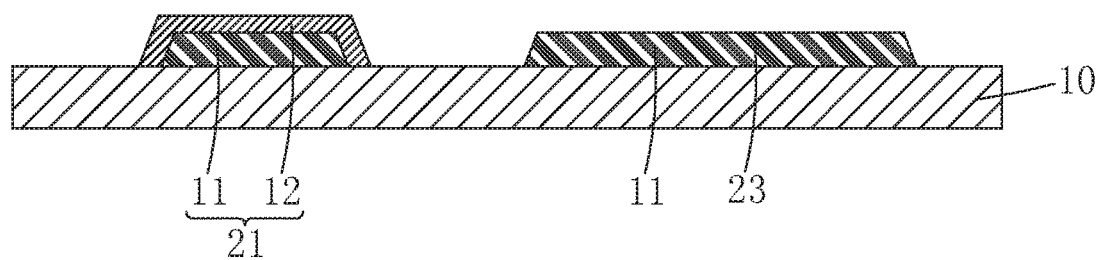
FIG. 5 is a schematic cross-sectional view of FIG. 4.

S12, as shown in FIGS. 4-5. A first metal layer 12 is plated on the predetermined pattern of the gate electrode 15 and the predetermined pattern of the scanning line 16, so as to obtain the gate electrode 21 and the scanning line 22. A conductivity of the first metal layer 12 is greater than a conductivity of the first transparent conductive layer 11.

Specifically, the first transparent conductive layer 11 is selected from a group consisting of a transparent conductive metal oxide such as indium tin oxide (ITO), and the first transparent conductive layer 11 is deposited by PVD.

Specifically, the first metal layer 12 is selected from the group consisting of copper.

Because the common electrode 23 and the common electrode line 24 do not need to have low resistance, the electrical performance requirement can be satisfied only by the first transparent conductive layer 11. Because the gate electrode 21 and the scanning line 22 need to have low resistance, the transparent conductive layer 11 is plated with the first metal layer 12 (it's better to be Copper) to have a better conductivity to prepare the gate electrode 21 and the scanning line 22, and the resistance value thereof can be reduced to meet the corresponding electrical performance requirements.

Specifically, a process of plating a first metal layer 12 on the predetermined pattern of the gate electrode 15 and the predetermined pattern of the scanning line 16 is an electroplating process. In the electroplating process, the predetermined pattern of the gate electrode 15 and the predetermined pattern of the scanning line 16 are electrically connected, however, the common electrode 23 and the common electrode line 24 are electrically disconnected, so that the first metal layer 12 can be only plated on the predetermined pattern of the gate electrode 15 and the predetermined pattern of the scanning line 16, instead of being plated on the common electrode 23 and the common electrode line 24.

Specifically, with plating the first metal layer 12 on the predetermined pattern of the gate electrode 15 and the predetermined pattern of the scanning line 16, the present invention can improve the conductivity performance of the gate electrode 21 and the scanning line 22.

Specifically, the base substrate 10 is a glass substrate.

Specifically, the first photomask process comprises processes of coating photoresist, exposure, development, dry etching and photoresist stripping.

Figure 6:
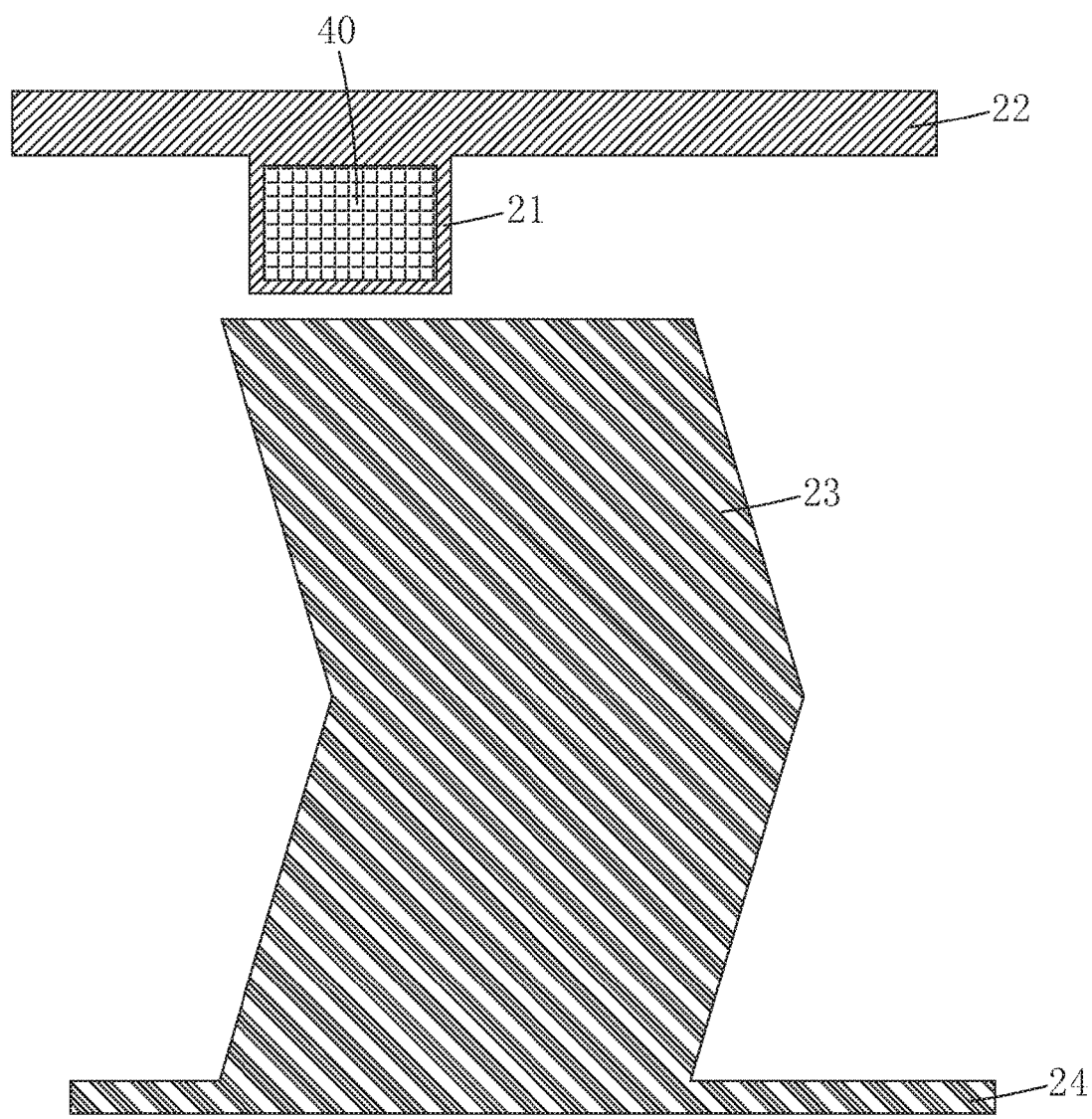
FIG. 6 is a schematic top view of a step S2 of the manufacturing method for an FFS type TFT array substrate according to the present invention.
Figure 7:
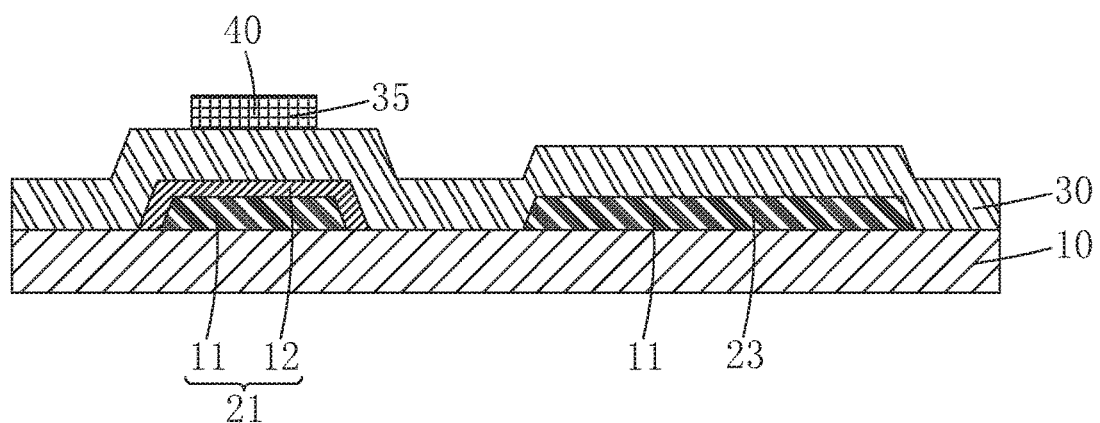
FIG. 7 is a schematic cross-sectional view of FIG. 6.

S2, as shown in FIGS. 6-7. A gate insulating layer 30 is deposited on the gate electrode 21, the scanning line 22, the common electrode 23, the common electrode line 24 and the base substrate 10. A semiconductor layer 35 is deposited on the gate insulating layer 30. The semiconductor layer 35 is patterned by using a second photomask process, so as to obtain an active layer 40 corresponding onto the gate electrode 21.

Specifically, the gate insulating layer 30 is selected from the group consisting of silicon oxide (SiOx) and silicon nitride (SiNx).

Specifically, the semiconductor layer 35 is selected from the group consisting of amorphous silicon, polycrystalline silicon, and metal oxide.

Specifically, the gate insulating layer 30 and the semiconductor layer 35 are both deposited by chemical vapor deposition (CVD).

Specifically, the second photomask process comprises processes of coating photoresist, exposure, development, dry etching and photoresist stripping.

Figure 8:
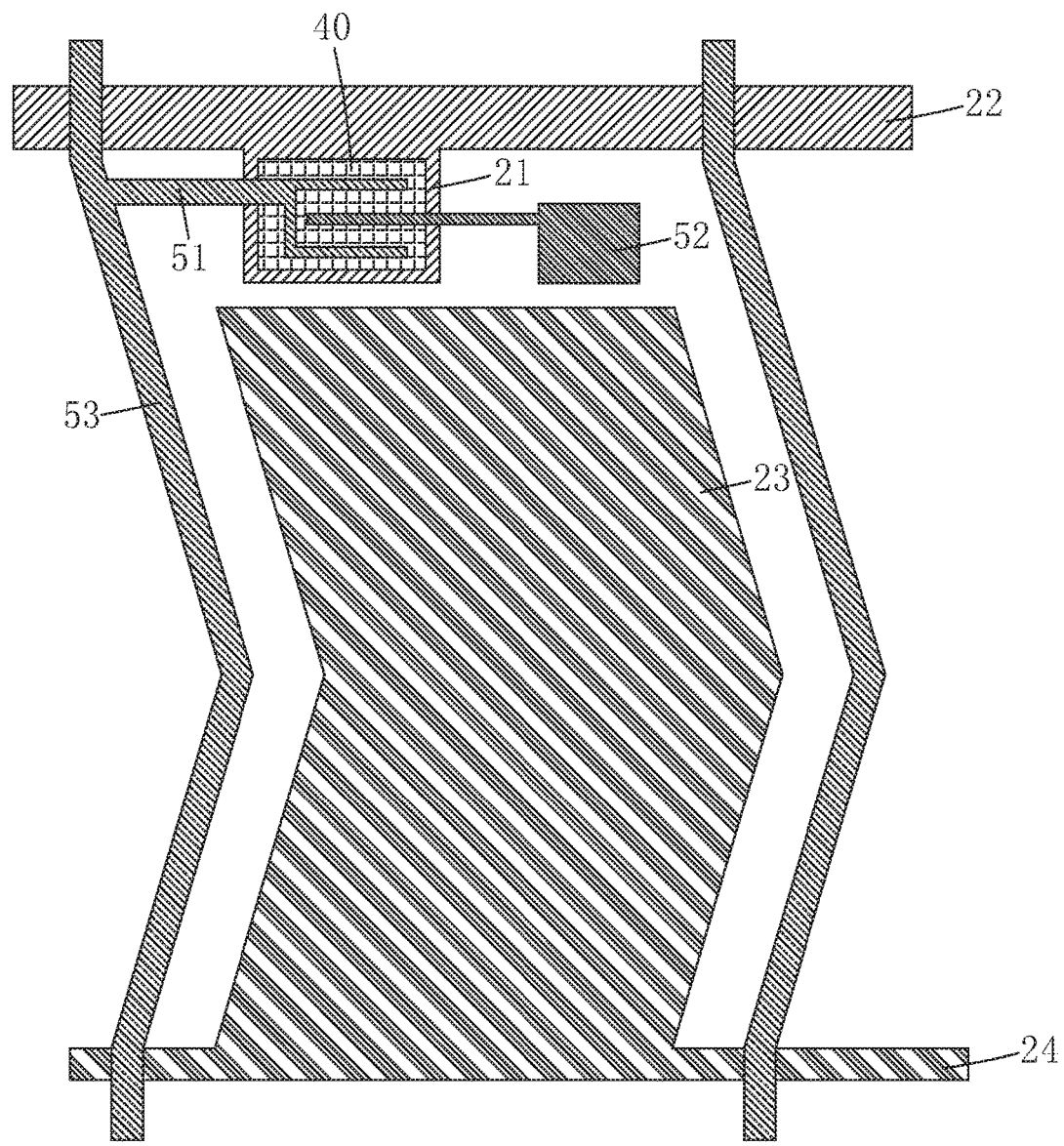
FIG. 8 is a schematic top view of a step S3 of the manufacturing method for an FFS type TFT array substrate according to the present invention.
Figure 9:
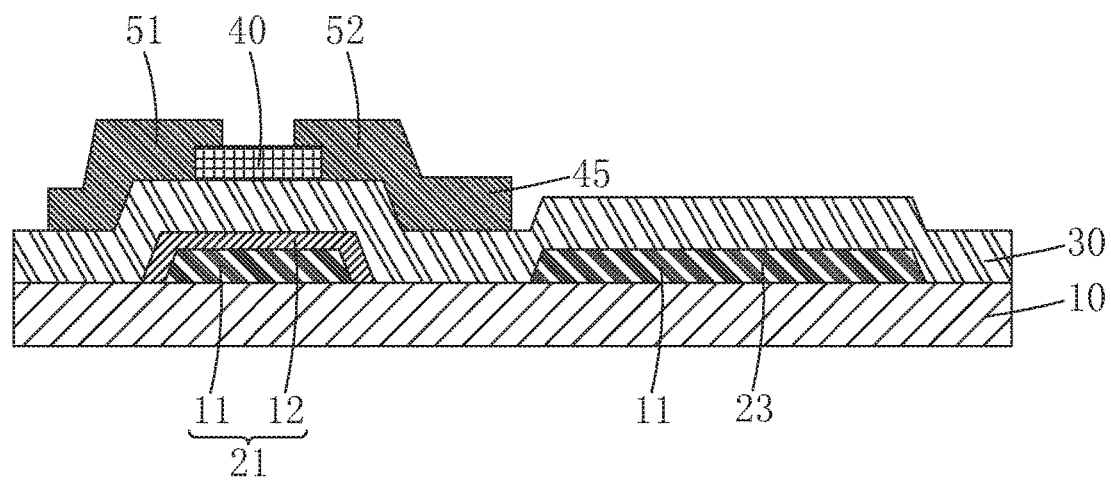
FIG. 9 is a schematic cross-sectional view of FIG. 8.

S3, as shown in FIGS. 8-9. A source/drain metal layer 45 is deposited on the active layer 40 and the gate insulating layer 30. The source/drain metal layer 45 is patterned by using a third photomask process, so as to obtain a source electrode 51, a drain electrode 52, and a data line 53. The source electrode 51 and the drain electrode 52 are respectively in contact with the active layer 40. The data line 53 is connected with the source electrode 51.

Specifically, the source/drain metal layer 45 is deposited by physical vapor deposition (PVD).

Specifically, the third photomask process comprises processes of coating photoresist, exposure, development, dry etching and photoresist stripping.

Figure 10:
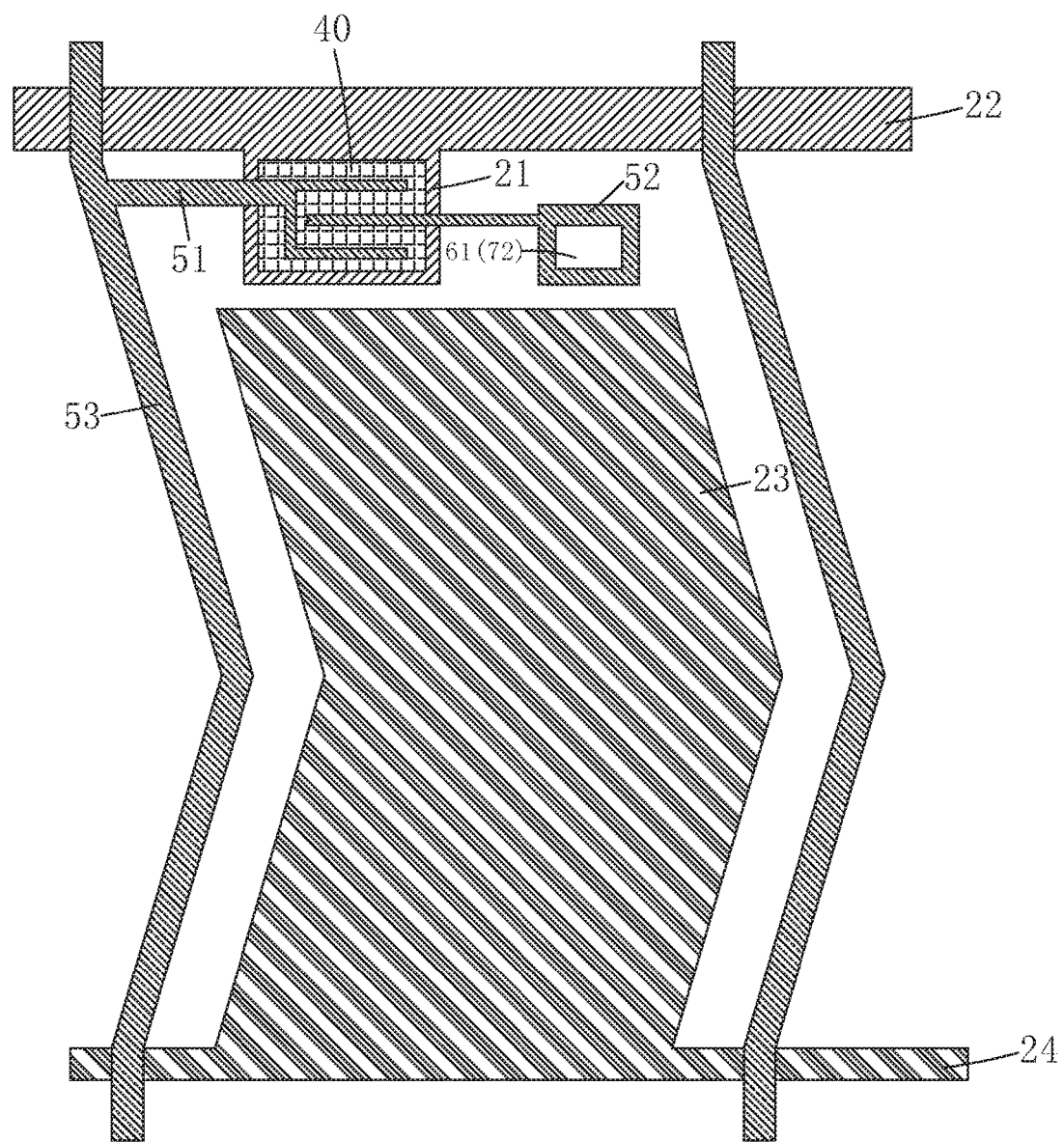
FIG. 10 is a schematic top view of a step S4 of the manufacturing method for an FFS type TFT array substrate according to the present invention.
Figure 11A:
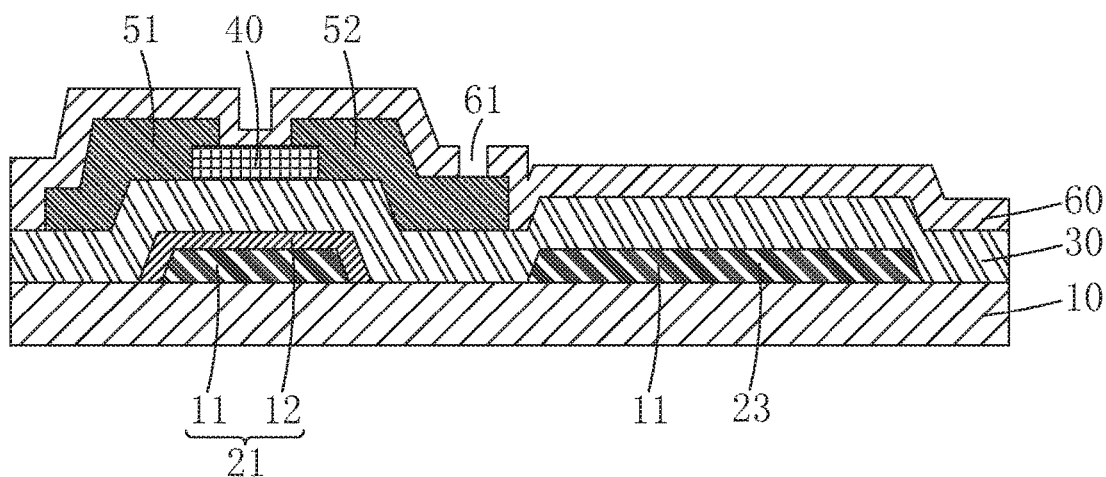
FIGS. 11a and 11b are schematic cross-sectional views of FIG. 10.

S4, as shown in FIGS. 10 and 11a. A passivation layer 60 is formed on the source electrode 51, the drain electrode 52, the data line 53, the active layer 40, and the gate insulating layer 30. The passivation layer 60 is patterned by using a fourth photomask process, so as to obtain a first through hole 61 located on the passivation layer 60. The first through hole 61 is disposed corresponding onto the drain electrode 52.

Figure 11B:
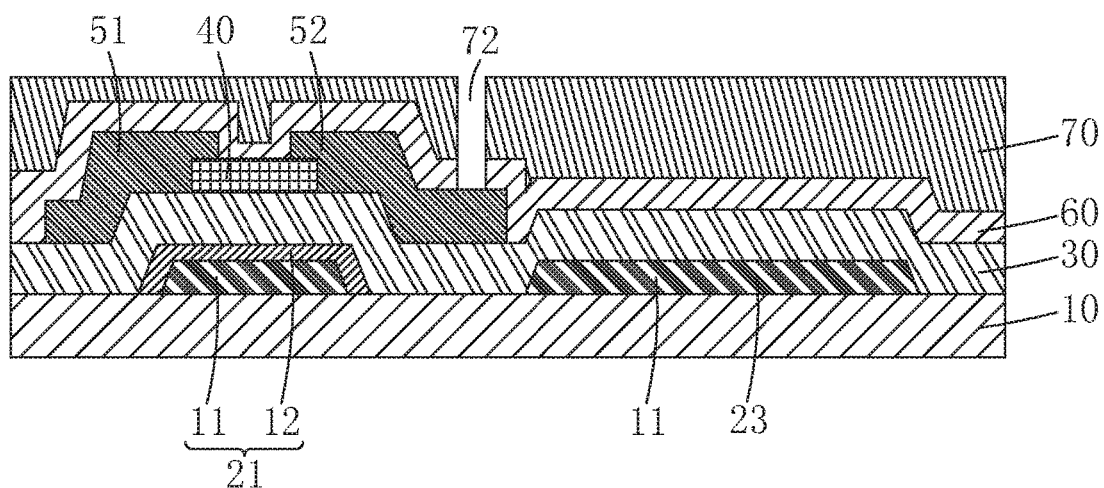

Or, as shown in FIGS. 10 and 11b. A passivation layer 60 is formed on the source electrode 51, the drain electrode 52, the data line 53, the active layer 40, and the gate insulating layer 30. A planer layer 70 is formed on the passivation layer 60. The passivation layer 60 and the planer layer 70 are patterned by using a fourth photomask process, so as to obtain a second through hole 72 located on the passivation layer 60 and the planer layer 70. The second through hole 72 is disposed corresponding onto the drain electrode 52.

Specifically, the passivation layer 60 is selected from the group consisting of silicon oxide (SiOx) and silicon nitride (SiNx). The passivation layer 60 is formed by CVD.

Specifically, the planer layer 70 is selected from the group consisting of an organic photoresist material. The planer layer 70 is formed by coating process.

Specifically, in S4, as shown in FIGS. 10 and 11a. After the passivation layer 60 is formed on the source electrode 51, the drain electrode 52, the data line 53, the active layer 40, and the gate insulating layer 30, the fourth photomask process comprises processes of coating photoresist, exposure, development, dry etching and photoresist stripping.

As shown in FIGS. 10 and 11b. After the passivation layer 60 is formed on the source electrode 51, the drain electrode 52, the data line 53, the active layer 40, and the gate insulating layer 30, and the planer layer 70 is formed on the passivation layer 60, the fourth photomask process comprises processes of exposure, development, and dry etching.

Specifically, by introducing the planer layer 70 on the passivation layer 60, the planarity of the pixel electrode 80, to be fabricated next, can be improved and the stability of the LCD panel can be further improved.

Figure 12:
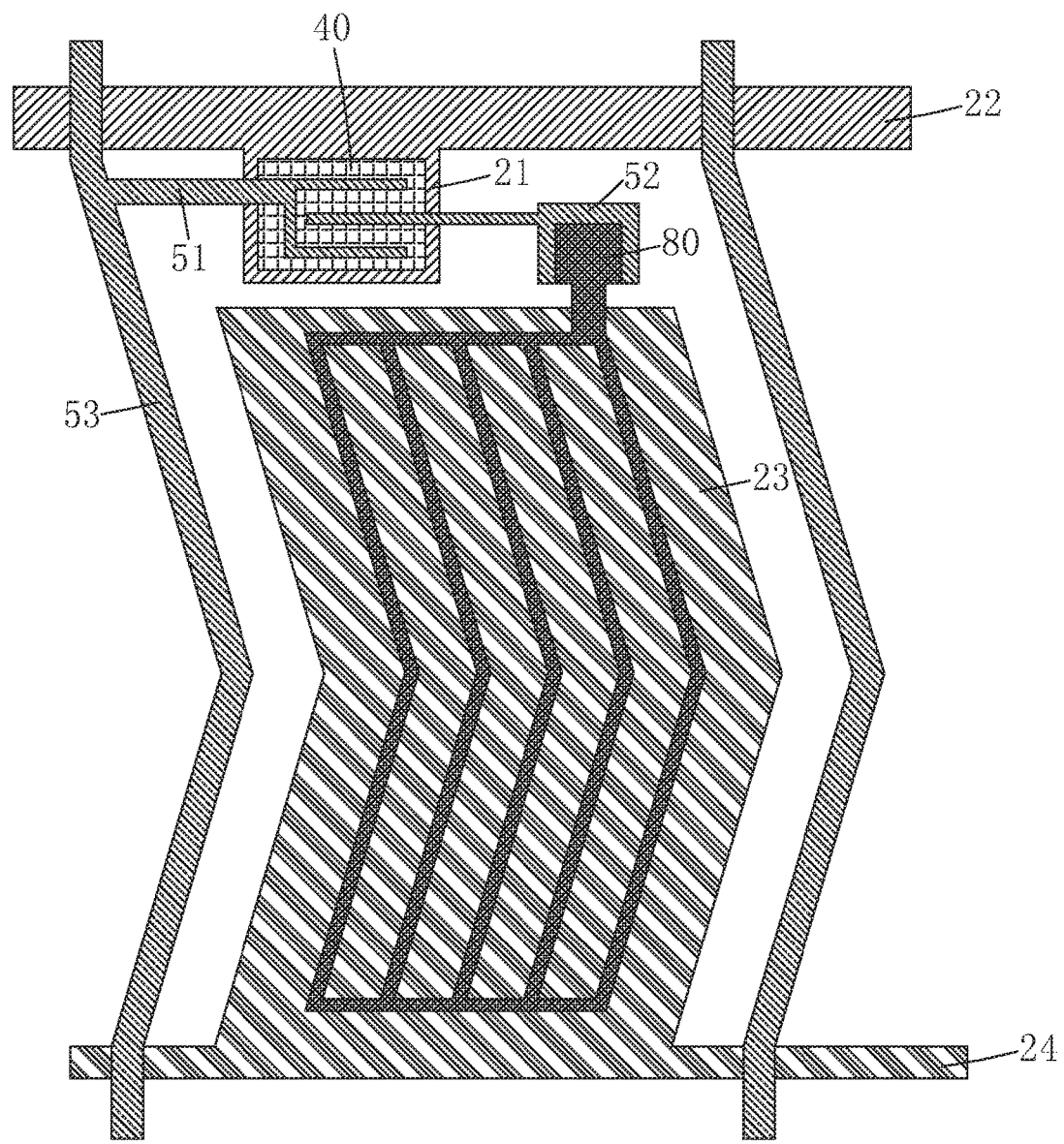
FIG. 12 is a schematic top view of a step S5 of the manufacturing method for an FFS type TFT array substrate according to the present invention.
Figure 13A:
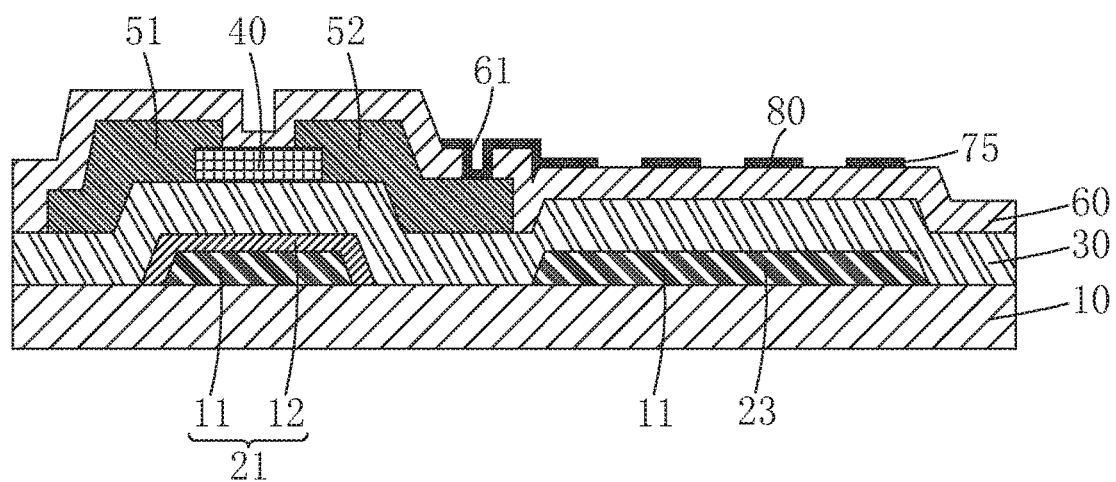
FIGS. 13a and 13b are schematic cross-sectional views of FIG. 12.

S5, as shown in FIGS. 12 and 13a. A second transparent conductive layer 75 is deposited on the passivation layer 60, and the second transparent conductive layer 75 is patterned by using a fifth photomask process, so as to obtain a pixel electrode 80 on the passivation layer 60. The pixel electrode 80 is connected with the drain electrode 52 via the first through hole 61 located on the passivation layer 60.

Figure 13B:
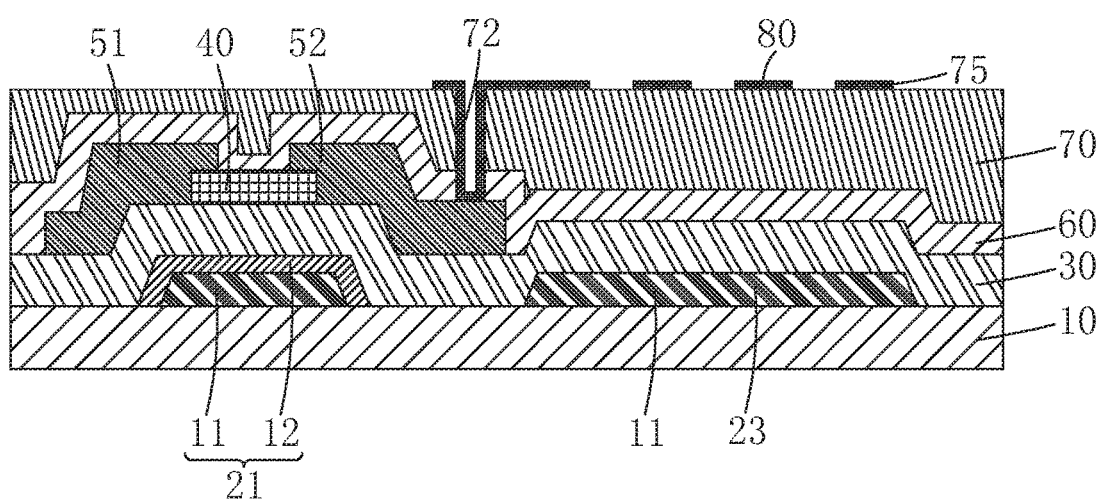

Or, as shown in FIGS. 12 and 13b. A second transparent conductive layer 75 is deposited on the planer layer 70. The second transparent conductive layer 75 is patterned by using a fifth photomask process, so as to obtain a pixel electrode 80 on the planer layer 70. The pixel electrode 80 is connected with the drain electrode 52 via the second through hole 72 located on the passivation layer 60 and the planer layer 70.

Specifically, the second transparent conductive layer 75 is selected from a group consisting of a transparent conductive metal oxide such as indium tin oxide (ITO), and the second transparent conductive layer 75 is deposited by PVD.

Specifically, the fifth photomask process comprises processes of coating photoresist, exposure, development, dry etching and photoresist stripping.

The manufacturing method for an FFS type TFT array substrate of the present invention comprises that a gate electrode 21, a scanning line 22, a common electrode 23, and a common electrode line 24 are formed in one photomask process. Comparing with the conventional art, the present invention simplifies the manufacturing process, with fewer photomasks, and a shorter processing time, therefore, the production cost is low.

Please refer to FIGS. 12, 13a, and 13b. Based on the above manufacturing method for an FFS type TFT array substrate, the present invention further provides an FFS TFT array substrate, which comprises:

A base substrate 10.

A gate electrode 21, a scanning line 22, a common electrode 23, and a common electrode line 24 are disposed on the base substrate 10. The gate electrode 21 is connected with the scanning line 22. The common electrode 23 is connected with the common electrode line 24.

A gate insulating layer 30 is disposed on the gate electrode 21, the scanning line 22, the common electrode 23, the common electrode line 24 and the base substrate 10.

An active layer 40 is disposed on the gate insulating layer 30 and corresponding onto the gate electrode 21.

A source electrode 51 and a drain electrode 52 are disposed on the active layer 40 and the gate insulating layer 30. A data line 53 is disposed on the gate insulating layer 30. The source electrode 51 and the drain electrode 52 are respectively in contact with the active layer 40. The data line 53 is connected with the source electrode 51.

A passivation layer 60 is disposed on the source electrode 51, the drain electrode 52, the data line 53, the active layer 40, and the gate insulating layer 30. A first through hole 61 is disposed on the passivation layer 60 and corresponding onto the drain electrode 52. A pixel electrode 80 is disposed on the passivation layer 60. The pixel electrode 80 is connected with the drain electrode 52 via the first through hole 61 located on the passivation layer 60.

Or, a passivation layer 60 is disposed on the source electrode 51, the drain electrode 52, the data line 53, the active layer 40, and the gate insulating layer 30. A planer layer 70 is disposed on the passivation layer 60. A second through hole 72 is disposed on the passivation layer 60 and the planer layer 70 and corresponding onto the drain electrode 52. A pixel electrode 80 is disposed on the planer layer 70. The pixel electrode 80 is connected with the drain electrode 52 via the second through hole 72 located on the passivation layer 60 and the planer layer 70.

Specifically, the common electrode 23 and the common electrode line 24 comprise a first transparent conductive layer 11 disposed on the base substrate 10. The gate electrode 21 and the scanning line 22 comprise the first transparent conductive layer 11 and a first metal layer 12 disposed on the first transparent conductive layer 11. A conductivity of the first metal layer 12 is greater than a conductivity of the first transparent conductive layer 11.

Specifically, the first transparent conductive layer 11 is selected from a group consisting of a transparent conductive metal oxide such as ITO.

Specifically, the first metal layer 12 is selected from the group consisting of copper.

Specifically, the base substrate 10 is a glass substrate.

Specifically, the gate insulating layer 30 is selected from the group consisting of silicon oxide (SiOx) and silicon nitride (SiNx).

Specifically, the active layer 40 is selected from the group consisting of amorphous silicon, polycrystalline silicon, and metal oxide.

Specifically, the passivation layer 60 is selected from the group consisting of silicon oxide (SiOx) and silicon nitride (SiNx). The planer layer 70 is selected from the group consisting of an organic photoresist material.

Specifically, the pixel electrode 80 is selected from a group consisting of a transparent conductive metal oxide such as ITO.

The fabrication process of the FFS type TFT array substrate of the present invention has a simple fabrication process, low production cost and excellent electrical performance.

As mentioned above, the manufacturing method for an FFS type TFT array substrate of the present invention comprises that a gate electrode, a scanning line, a common electrode, and a common electrode line are formed in one photomask process. Comparing with the conventional art, the present invention simplifies the manufacturing process, with fewer photomasks, and a shorter processing time, therefore, the production cost is low. The fabrication process of the FFS type TFT array substrate of the invention is simple, has low production cost and excellent electrical performance.

As mentioned above, those of ordinary skill in the art, without departing from the spirit and scope of the present invention, can make various kinds of modifications and variations to the present invention. Therefore, all such modifications and variations are intended to be included in the protection scope of the appended claims of the present invention.

What is claimed is:

1. A manufacturing method for a fringe field switching (FFS) type thin film transistor (TFT) array substrate, comprising:

providing a base substrate, and forming a gate electrode, a scanning line, a common electrode and a common electrode line on the base substrate by using a first photomask process; wherein the gate electrode is connected with the scanning line, and the common electrode is connected with the common electrode line;

depositing a gate insulating layer on the gate electrode, the scanning line, the common electrode, the common electrode line and the base substrate, and depositing a semiconductor layer on the gate insulating layer, patterning the semiconductor layer by using a second photomask process, so as to obtain an active layer corresponding onto the gate electrode;

disposing a source/drain metal layer on the active layer and the gate insulating layer, and patterning the source/drain metal layer by using a third photomask process, so as to obtain a source electrode, a drain electrode, and a data line; wherein, the source electrode and the drain electrode are respectively in contact with the active layer; the data line is connected with the source electrode;

forming a passivation layer on the source electrode, the drain electrode, the data line, the active layer, and the gate insulating layer, patterning the passivation layer by using a fourth photomask process, so as to obtain a first through hole located on the passivation layer, the first through hole corresponding onto the drain electrode; depositing a second transparent conductive layer on the passivation layer, and patterning the second transparent conductive layer by using a fifth photomask process, so as to obtain a pixel electrode on the passivation layer; wherein the pixel electrode is connected with the drain electrode via the first through hole located on the passivation layer; or forming a passivation layer on the source electrode, the drain electrode, the data line, the active layer, and the gate insulating layer, and forming a planer layer on the passivation layer, patterning the passivation layer and the planer layer by using a fourth photomask process, so as to obtain a second through hole located on the passivation layer and the planer layer, the second through hole corresponding onto the drain electrode; depositing a second transparent conductive layer on the planer layer, and patterning the second transparent conductive layer by using a fifth photomask process, so as to obtain a pixel electrode on the planer layer; wherein the pixel electrode is connected with the drain electrode via the second through hole located on the passivation layer and the planer layer;

wherein the gate electrode and the scanning line have a dual-layer structure comprising a layer of a first material and a second layer of a second material disposed on a top of the layer of the first material layer, and common electrode and the common electrode line have a single-layer structure comprising a layer of the first material.

2. The manufacturing method for a FFS type TFT array substrate according to claim 1, wherein in the step of forming a gate electrode, a scanning line, a common electrode and a common electrode line on the base substrate by using a first photomask process further comprises:

depositing a first transparent conductive layer on the base substrate, patterning the first transparent conductive layer by using the first photomask process, so as to obtain a predetermined pattern of the gate electrode and a predetermined pattern of the scanning line, the common electrode, and the common electrode line;

plating a first metal layer on the predetermined pattern of the gate electrode and the predetermined pattern of the scanning line, so as to obtain the gate electrode and the scanning line; wherein a conductivity of the first metal layer is greater than a conductivity of the first transparent conductive layer.

3. The manufacturing method for a FFS type TFT array substrate according to claim 2, wherein the first transparent conductive layer is selected from the group consisting of transparent conductive metal oxide; and the first metal layer is selected from the group consisting of copper.

4. The manufacturing method for a FFS type TFT array substrate according to claim 2, wherein a process of plating a first metal layer on the predetermined pattern of the gate electrode and the predetermined pattern of the scanning line is an electroplating process.

5. The manufacturing method for a FFS type TFT array substrate according to claim 1, wherein the passivation layer is selected from the group consisting of silicon oxide and silicon nitride, and the planer layer is selected from the group consisting of an organic photoresist material.

6. The manufacturing method for a FFS type TFT array substrate according to claim 1, wherein after forming the passivation layer on the source electrode, the drain electrode, the data line, the active layer, and the gate insulating layer, the fourth photomask process comprises processes of coating photoresist, exposure, development, dry etching and photoresist stripping;

after forming the passivation layer on the source electrode, the drain electrode, the data line, the active layer, and the gate insulating layer, and after forming the planer layer on the passivation layer, the fourth photomask process comprises processes of exposure, development, and dry etching.

7. A fringe field switching (FFS) type thin film transistor (TFT) array substrate, comprising:

a base substrate;

a gate electrode, a scanning line, a common electrode, and a common electrode line being disposed on the base substrate; wherein the gate electrode is connected with the scanning line, and the common electrode is connected with the common electrode line;

a gate insulating layer being disposed on the gate electrode, the scanning line, the common electrode, the common electrode line and the base substrate;

an active layer being disposed on the gate insulating layer and corresponding onto the gate electrode;

a source electrode and a drain electrode being disposed on the active layer and the gate insulating layer, and a data line being disposed on the gate insulating layer; wherein, the source electrode and the drain electrode are respectively in contact with the active layer; the data line is connected with the source electrode;

a passivation layer being disposed on the source electrode, the drain electrode, the data line, the active layer, and the gate insulating layer; a first through hole being disposed on the passivation layer and corresponding onto the drain electrode; a pixel electrode being disposed on the passivation layer; wherein the pixel electrode is connected with the drain electrode via the first through hole located on the passivation layer; or a passivation layer being disposed on the source electrode, the drain electrode, the data line, the active layer, and the gate insulating layer, and a planer layer being disposed on the passivation layer, a second through hole being disposed on the passivation layer and the planer layer and corresponding onto the drain electrode; a pixel electrode being disposed on the planer layer; wherein the pixel electrode is connected with the drain electrode via the second through hole located on the passivation layer and the planer layer;

wherein the gate electrode and the scanning line have a dual-layer structure comprising a layer of a first material and a second layer of a second material disposed on a top of the layer of the first material layer, and common electrode and the common electrode line have a single-layer structure comprising a layer of the first material.

8. The FFS type TFT array substrate according to claim 7, wherein the common electrode and the common electrode line comprise a first transparent conductive layer disposed on the base substrate, the gate electrode and the scanning line comprise the first transparent conductive layer and a first metal layer disposed on the first transparent conductive layer; wherein a conductivity of the first metal layer is greater than a conductivity of the first transparent conductive layer.

9. The FFS type TFT array substrate according to claim 8, wherein the first transparent conductive layer is selected from the group consisting of transparent conductive metal oxide; and the first metal layer is selected from the group consisting of copper.

10. The FFS type TFT array substrate according to claim 7, wherein the passivation layer is selected from the group consisting of silicon oxide and silicon nitride, and the planer layer is selected from the group consisting of an organic photoresist material.

11. A manufacturing method for a fringe field switching (FFS) type thin film transistor (TFT) array substrate, comprising:

providing a base substrate, and forming a gate electrode, a scanning line, a common electrode and a common electrode line on the base substrate by using a first photomask process; wherein the gate electrode is connected with the scanning line, and the common electrode is connected with the common electrode line;

depositing a gate insulating layer on the gate electrode, the scanning line, the common electrode, the common electrode line and the base substrate, and depositing a semiconductor layer on the gate insulating layer, patterning the semiconductor layer by using a second photomask process, so as to obtain an active layer corresponding onto the gate electrode;

disposing a source/drain metal layer on the active layer and the gate insulating layer, and patterning the source/drain metal layer by using a third photomask process, so as to obtain a source electrode, a drain electrode, and a data line; wherein, the source electrode and the drain electrode are respectively in contact with the active layer; the data line is connected with the source electrode;

forming a passivation layer on the source electrode, the drain electrode, the data line, the active layer, and the gate insulating layer, patterning the passivation layer by using a fourth photomask process, so as to obtain a first through hole located on the passivation layer, the first through hole being corresponding onto the drain electrode; depositing a second transparent conductive layer on the passivation layer, and patterning the second transparent conductive layer by using a fifth photomask process, so as to obtain a pixel electrode on the passivation layer; wherein the pixel electrode is connected with the drain electrode via the first through hole located on the passivation layer; or forming a passivation layer on the source electrode, the drain electrode, the data line, the active layer, and the gate insulating layer, and forming a planer layer on the passivation layer, patterning the passivation layer and the planer layer by using a fourth photomask process, so as to obtain a second through hole located on the passivation layer and the planer layer, the second through hole being corresponding onto the drain electrode; depositing a second transparent conductive layer on the planer layer, and patterning the second transparent conductive layer by using a fifth photomask process, so as to obtain a pixel electrode on the planer layer; wherein the pixel electrode is connected with the drain electrode via the second through hole located on the passivation layer and the planer layer;

wherein in the step of forming a gate electrode, a scanning line, a common electrode and a common electrode line on the base substrate by using a first photomask process further comprises:

depositing a first transparent conductive layer on the base substrate, patterning the first transparent conductive layer by using the first photomask process, so as to obtain a predetermined pattern of the gate electrode and a predetermined pattern of the scanning line, the common electrode, and the common electrode line;

plating a first metal layer on the predetermined pattern of the gate electrode and the predetermined pattern of the scanning line, so as to obtain the gate electrode and the scanning line; wherein a conductivity of the first metal layer is greater than a conductivity of the first transparent conductive layer;

wherein the first transparent conductive layer is selected from the group consisting of transparent conductive metal oxide; and the first metal layer is selected from the group consisting of copper;

wherein a process of plating a first metal layer on the predetermined pattern of the gate electrode and the predetermined pattern of the scanning line is an electroplating process;

wherein the passivation layer is selected from the group consisting of silicon oxide and silicon nitride, and the planer layer is selected from the group consisting of an organic photoresist material; and wherein the gate electrode and the scanning line have a dual-layer structure comprising a layer of a first material and a second layer of a second material disposed on a top of the layer of the first material layer, and common electrode and the common electrode line have a single-layer structure comprising a layer of the first material, the layer of the first material comprising the first transparent conductive layer, the layer of the second material comprising the first metal layer.

12. The manufacturing method for a FFS type TFT array substrate according to claim 11, wherein after forming the passivation layer on the source electrode, the drain electrode, the data line, the active layer, and the gate insulating layer, the fourth photomask process comprises processes of coating photoresist, exposure, development, dry etching and photoresist stripping;

after forming the passivation layer on the source electrode, the drain electrode, the data line, the active layer, and the gate insulating layer, and after forming the planer layer on the passivation layer, the fourth photomask process comprises processes of exposure, development, and dry etching.

\* \* \* \* \*